(12) United States Patent
Saito

(10) Patent No.: US 11,057,032 B2
(45) Date of Patent: Jul. 6, 2021

(54) CONTROL CIRCUIT AND IDEAL DIODE CIRCUIT

(71) Applicant: SHINDENGEN ELECTRIC MANUFACTURING CO., LTD., Tokyo (JP)

(72) Inventor: Kazuhiko Saito, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/626,056

(22) PCT Filed: Jun. 30, 2017

(86) PCT No.: PCT/JP2017/024167
§ 371 (c)(1),
(2) Date: Dec. 23, 2019

(87) PCT Pub. No.: WO2019/003421
PCT Pub. Date: Jan. 3, 2019

(65) Prior Publication Data
US 2021/0119626 A1 Apr. 22, 2021

(51) Int. Cl.
*H03K 17/16* (2006.01)
*H02M 1/00* (2006.01)
(Continued)

(52) U.S. Cl.
CPC ............ *H03K 17/302* (2013.01); *G05F 1/56* (2013.01); *H02M 7/21* (2013.01); *H03K 17/687* (2013.01);
(Continued)

(58) Field of Classification Search
None
See application file for complete search history.

(56) References Cited

U.S. PATENT DOCUMENTS 9,755,629 B2 * 9/2017 Ali ................ H03K 17/063
10,396,667 B2 * 8/2019 Kawano ............... H02M 1/32
(Continued)

FOREIGN PATENT DOCUMENTS

CN 1449084 A 10/2003
CN 101071984 A 11/2007
(Continued)

OTHER PUBLICATIONS

First Office Action dated Nov. 25, 2020 in Chinese Application No. 2017800901550, with English translation, 24 pages.
(Continued)

*Primary Examiner* — Kenneth B Wells
(74) *Attorney, Agent, or Firm* — Nixon & Vanderhye P.C.

(57) ABSTRACT

A control circuit includes: a transistor controller that controls a voltage at a gate terminal of a field effect transistor in accordance with a difference in voltage between a source terminal and a drain terminal of the field effect transistor connected so that a body diode is in a forward direction; and a current controller that reduces an operating current for operating the transistor controller when a load connected via the source terminal of the field effect transistor is light, and increases the operating current when the load is heavy.

7 Claims, 7 Drawing Sheets

(51) Int. Cl.
*H02M 1/08* (2006.01)
*H02M 7/219* (2006.01)
*H03K 17/30* (2006.01)
*G05F 1/56* (2006.01)
*H03K 17/687* (2006.01)
*H02M 7/21* (2006.01)

(52) U.S. Cl.
CPC ............... *H02M 2001/0009* (2013.01); *H02M 2001/0025* (2013.01)

(56) References Cited

U.S. PATENT DOCUMENTS

| | | | |
|---|---|---|---|
| 10,613,561 B1 * | 4/2020 | Jeong | .................. H03K 17/223 |
| 2009/0261798 A1 | 10/2009 | Sachdev et al. | |
| 2013/0162230 A1 | 6/2013 | Miyamae | |
| 2016/0241225 A1 | 8/2016 | Ali | |

FOREIGN PATENT DOCUMENTS

| | | |
|---|---|---|
| CN | 102386911 A | 3/2012 |
| JP | 2003-244946 | 8/2003 |
| JP | 3655247 B2 | 6/2005 |
| JP | 2013-255425 | 12/2013 |
| WO | 2010/004738 | 1/2010 |
| WO | WO 2016/106431 A1 | 6/2016 |

OTHER PUBLICATIONS

Extended European Search Report dated Dec. 12, 2020 in European Application No. 17916013.0, 7 pages.
International Search Report for PCT/JP2017/024167 dated Sep. 12, 2017, 2 pages.
Written Opinion of the ISA for PCT/JP2017/024167 dated Sep. 12, 2017, 4 pages.

* cited by examiner

[FIG. 1]
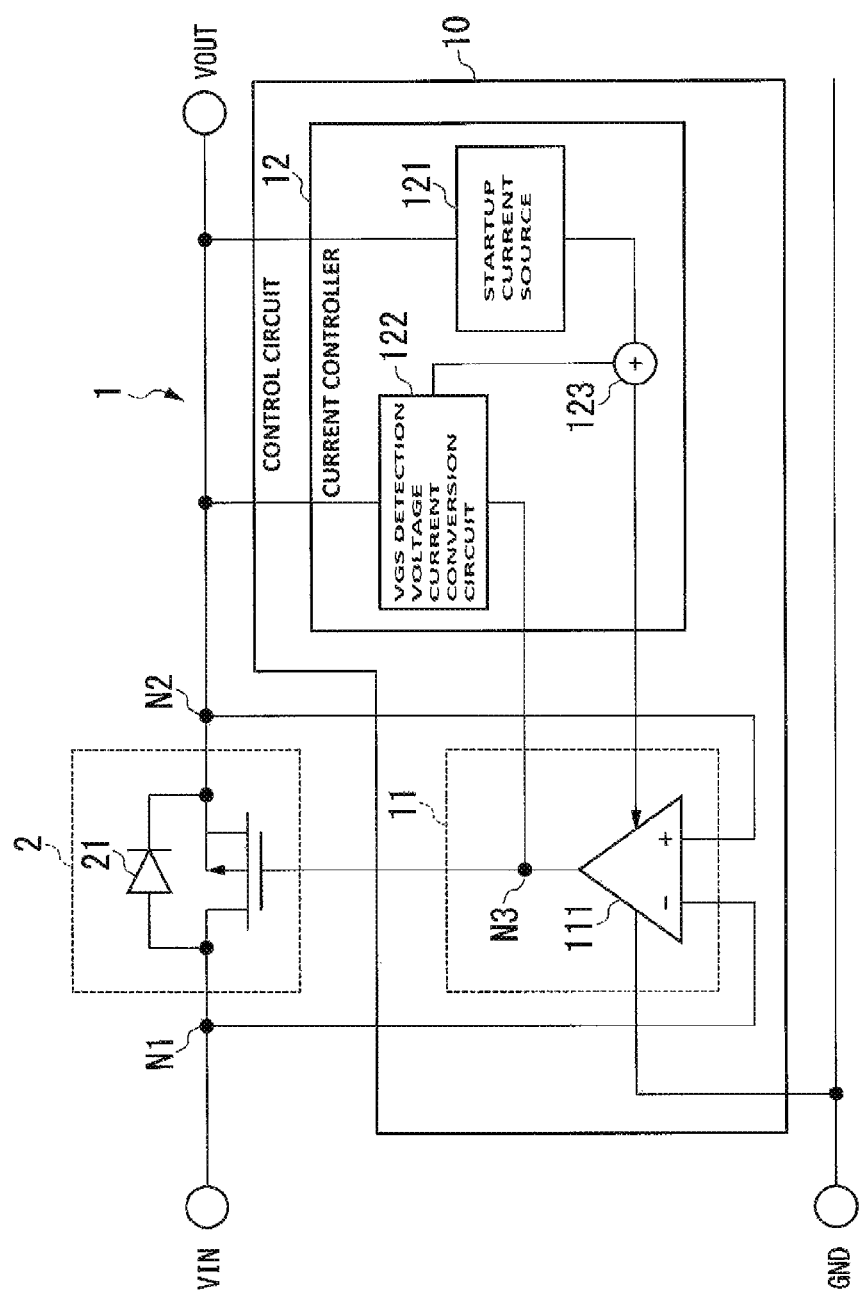

[FIG. 2]
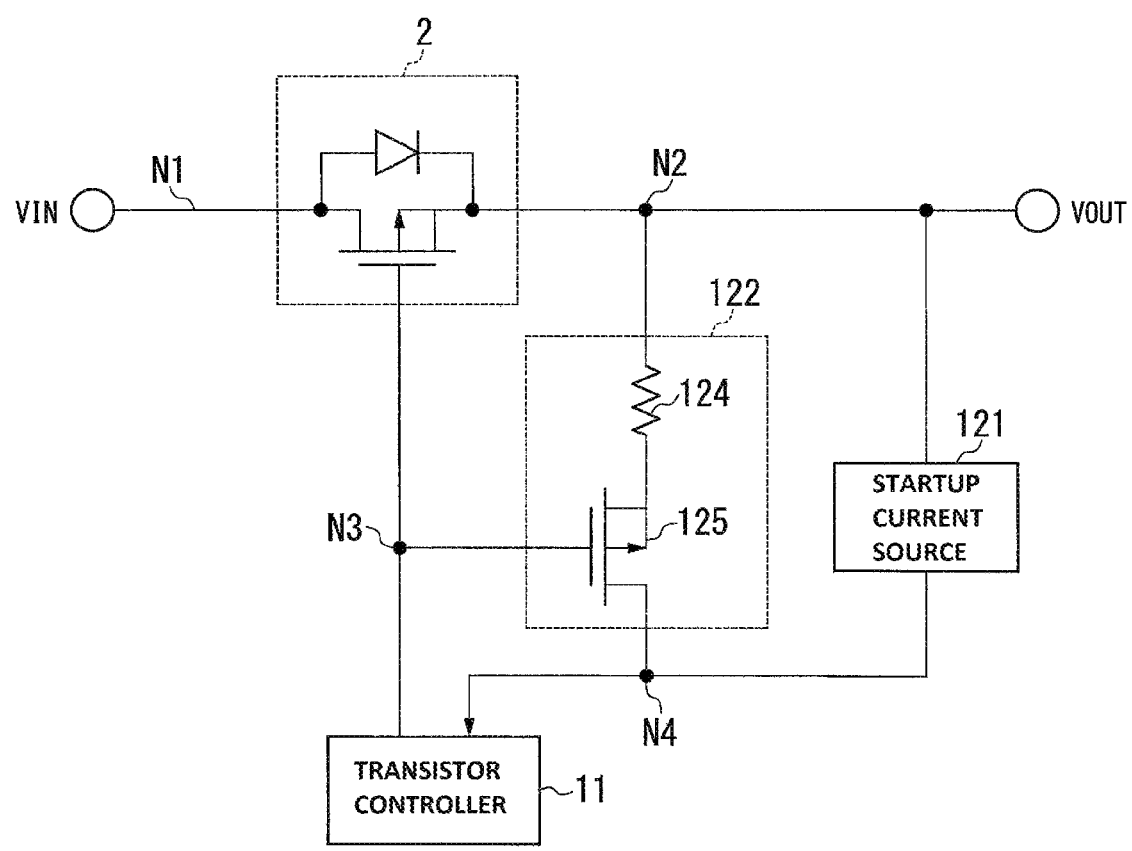

[FIG. 3]
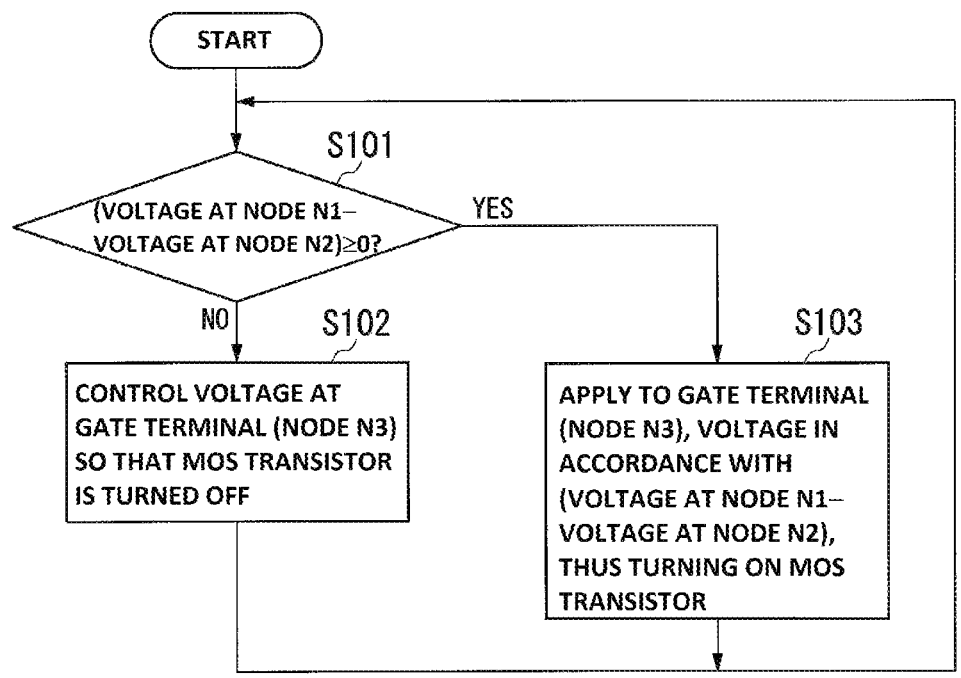
[FIG. 4]
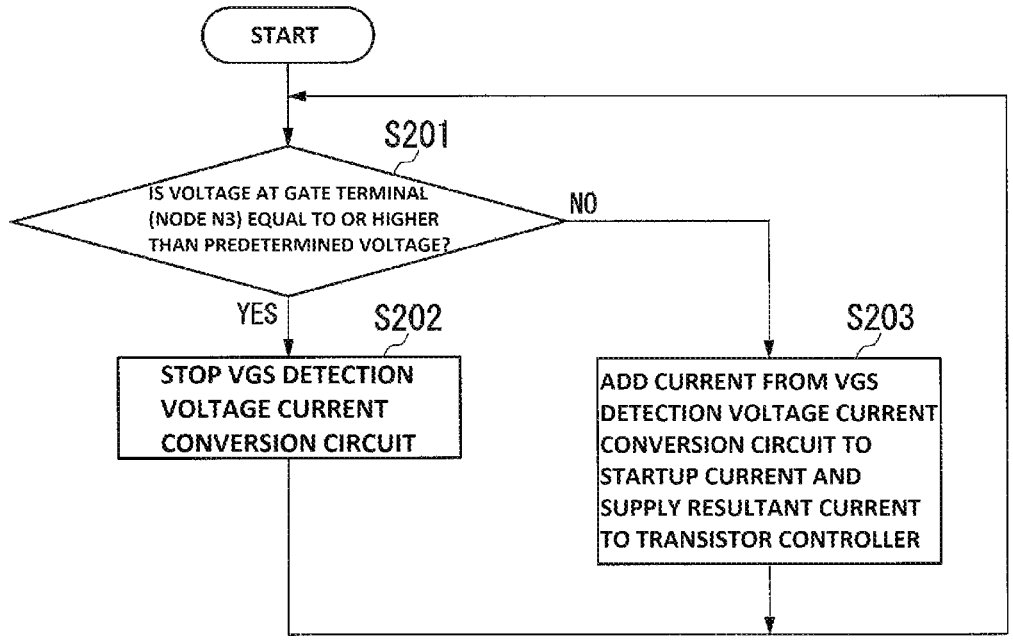

[FIG. 5]
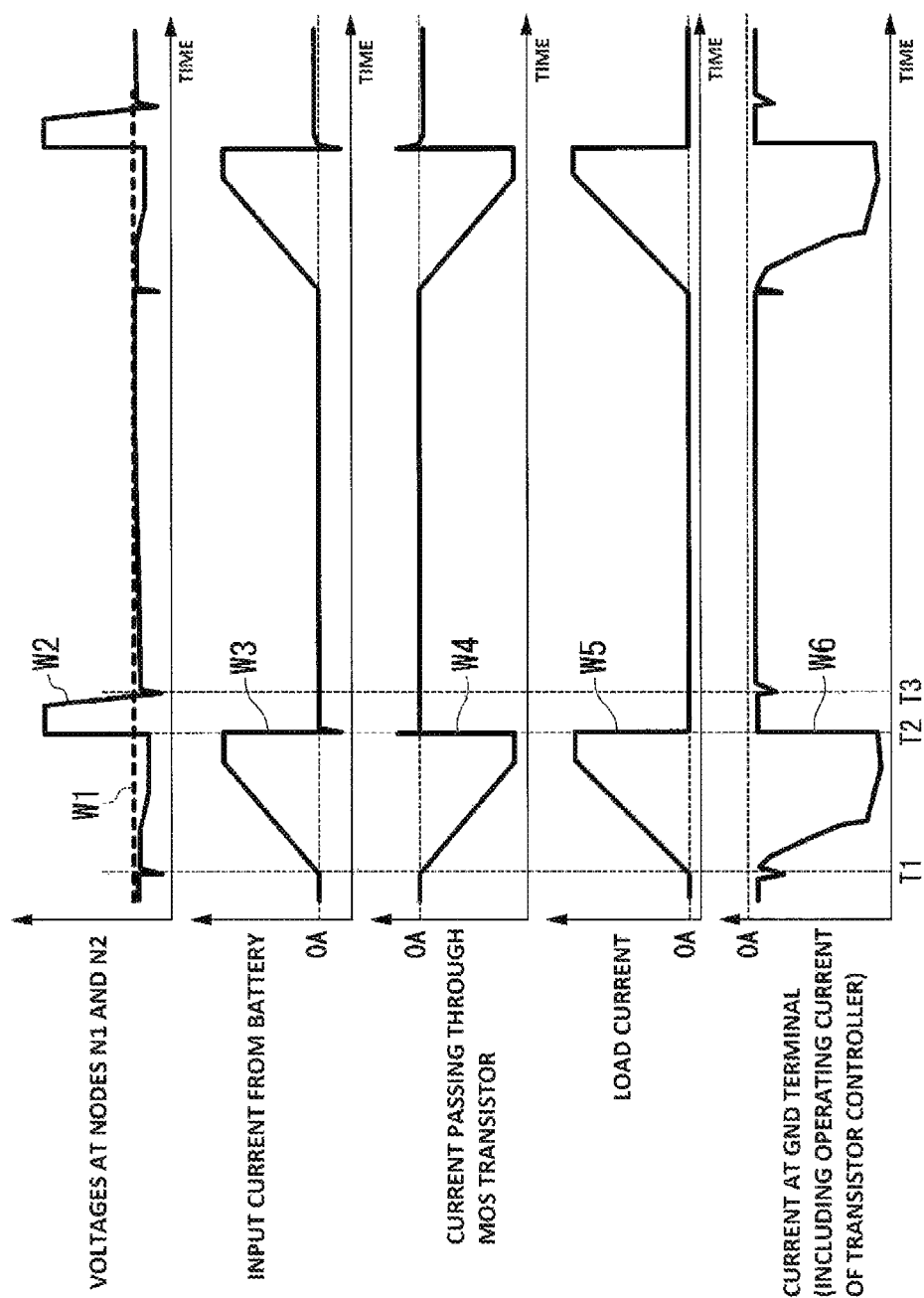

[FIG. 6]
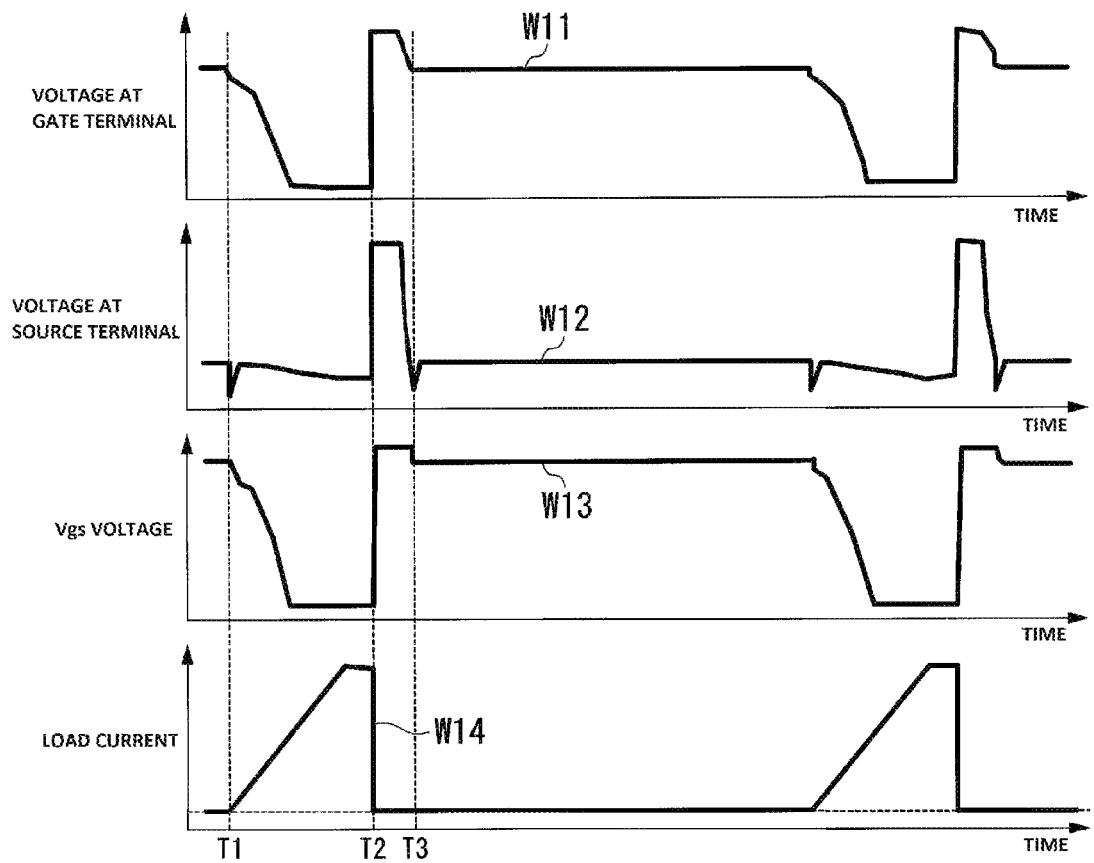
[FIG. 7]
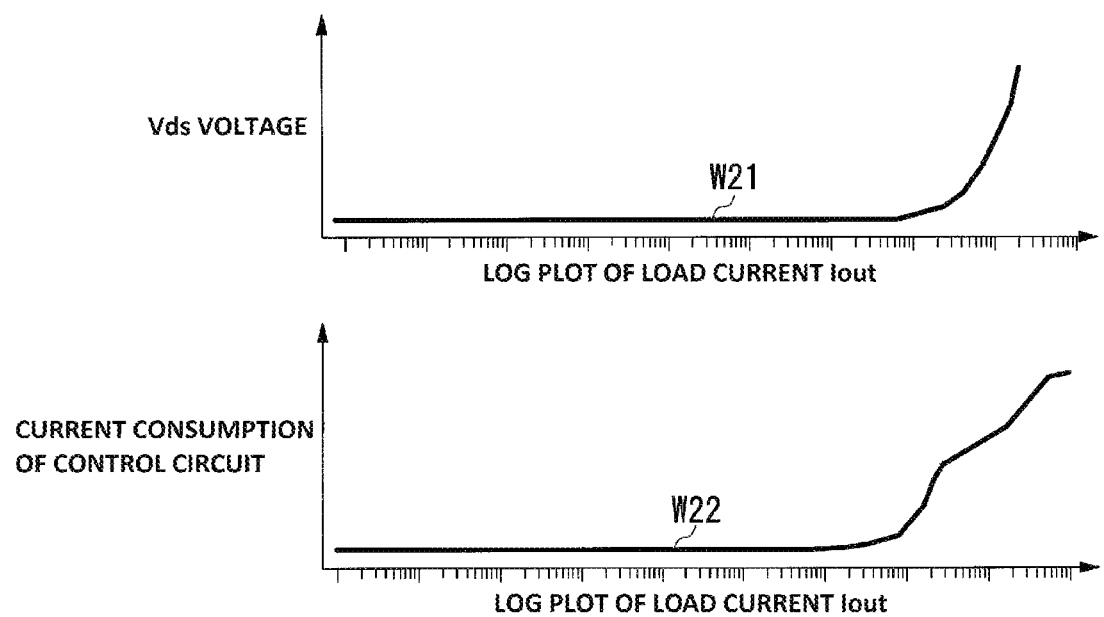

[FIG. 8]
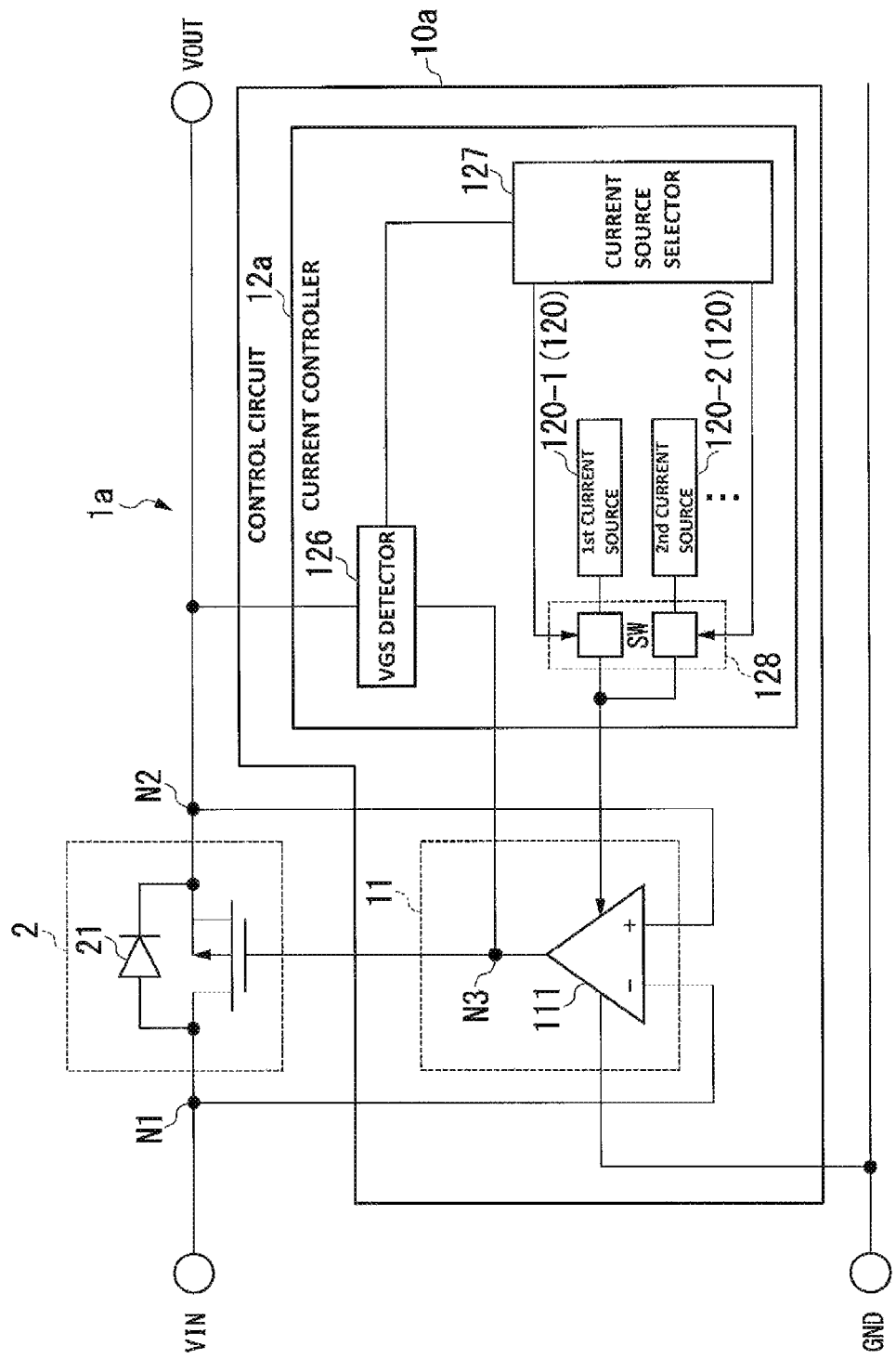

[FIG. 9]
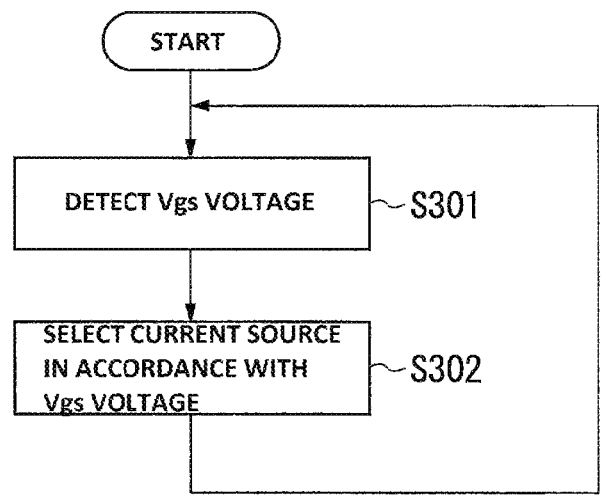

CONTROL CIRCUIT AND IDEAL DIODE CIRCUIT

This application is the U.S. national phase of International Application No. PCT/JP2017/024167 filed Jun. 30, 2017 which designated the U.S., and the entire contents of each of which are hereby incorporated by reference.

TECHNICAL FIELD

The present invention relates to a control circuit and an ideal diode circuit.

BACKGROUND ART

In recent years, a technique of using a field effect transistor as an ideal diode is known (see, for example, Patent Document 1). In such an ideal transistor, a control circuit includes a comparator that compares a source voltage and a drain voltage of the field effect transistor, and controls a gate voltage in accordance with a comparison result of the comparator, thereby controlling the field effect transistor to operate as a diode.

CITATION LIST

Patent Literature

[Patent Literature 1] Japanese Application Publication No. 2013-255425

SUMMARY OF THE INVENTION

Problems to be Solved by the Invention

However, in the above-described conventional control circuit, for example, when it is necessary to flow a large current through the ideal diode, it has been necessary to increase the drive capability for controlling the gate voltage in order to prevent backflow when blocking backflow. For this reason, the conventional control circuit has a problem that, for example, current consumption increases in a standby state in which a light load is connected to the ideal diode.

The present invention has been made to solve the above problem, and an object thereof is to provide a control circuit and an ideal diode circuit capable of reducing current consumption in the standby state while maintaining the function of the ideal diode.

Means for Solving the Problems

To solve the above problem, a control circuit according to one aspect of the present invention includes: a transistor controller that controls a voltage at a gate terminal of a field effect transistor in accordance with a difference in voltage between a source terminal and a drain terminal of the field effect transistor connected so that a body diode is in a forward direction; and a current controller that reduces an operating current for operating the transistor controller when a load connected via the source terminal of the field effect transistor is light, and increases the operating current when the load is heavy.

Additionally, in the above control circuit according to one aspect of the present invention, the current controller may reduce the operating current for operating the transistor controller when the voltage at the gate terminal becomes a voltage at which a transistor current flowing through the field effect transistor becomes equal to or lower than a predetermined current value, and increase the operating current when the voltage at the gate terminal becomes a voltage at which the transistor current exceeds the predetermined current value.

Additionally, in the above control circuit according to one aspect of the present invention, the current controller may include: a first current source that supplies a constant current serving as a reference for the operating current at the time of startup; and a second current source that adds and supplies an additional constant current to the first current source when the voltage at the gate terminal becomes the voltage at which the transistor current flowing through the field effect transistor exceeds the predetermined current value.

Additionally, in the above control circuit according to one aspect of the present invention, the current controller may include a plurality of current sources each of which supplies a constant current serving as a reference for the operating current, switch the plurality of current sources in accordance with the voltage at the gate terminal, and supply the constant current serving as the reference for the operating current.

Additionally, in the above control circuit according to one aspect of the present invention, the current controller may select any one or a combination of the plurality of current sources in accordance with the voltage at the gate terminal, and supply the constant current serving as the reference for the operating current.

Additionally, in the above control circuit according to one aspect of the present invention, the transistor controller may include a differential amplifier circuit that controls the voltage at the gate terminal in accordance with the difference in voltage between the drain terminal and the source terminal.

Additionally, an ideal diode circuit according to one aspect of the present invention includes: the above-described control circuit; and the field effect transistor.

Effects of the Invention

According to the present invention, the transistor controller controls the voltage at the gate terminal of the field effect transistor in accordance with the difference in voltage between the source terminal and the drain terminal of the field effect transistor connected so that the body diode is in the forward direction. Then, the current controller reduces the operating current for operating the transistor controller when the load connected via the source terminal of the field effect transistor is light. Additionally, the current controller increases the operating current when the load is heavy. As a result, the control circuit reduces the operating current for operating the transistor controller in a standby state, such as during a light load, so that the current consumption can be reduced in the standby state while maintaining the function of the ideal diode.

BRIEF DESCRIPTION OF THE DRAWINGS

FIG. 1 is a block diagram showing an example of a configuration of an ideal diode circuit according to a first embodiment.

FIG. 2 is a diagram showing a configuration example of a VGS detection voltage current conversion circuit according to the first embodiment.

FIG. 3 is a flowchart showing an example of operation of a transistor controller in the first embodiment.

FIG. 4 is a flowchart showing an example of operation of a current controller in the first embodiment.

FIG. 5 is a first timing chart showing an example of operation of a control circuit in the first embodiment.

FIG. 6 is a second timing chart showing an example of the operation of the control circuit in the first embodiment.

FIG. 7 is a diagram showing an example of operation of the current controller in the first embodiment.

FIG. 8 is a block diagram showing an example of a configuration of an ideal diode circuit according to a second embodiment.

FIG. 9 is a flowchart showing an example of operation of a current controller in the second embodiment.

MODE FOR CARRYING OUT THE INVENTION

Hereinafter, a control circuit and an ideal diode circuit according to an embodiment of the present invention will be described with reference to the drawings.

First Embodiment

FIG. 1 is a block diagram showing an example of a configuration of an ideal diode circuit 1 according to the present embodiment.

As shown in FIG. 1, the ideal diode circuit 1 includes a MOS transistor 2 and a control circuit 10.

It is assumed that the ideal diode circuit 1 is connected between a DC power source (not shown) such as a battery and a load (not shown). That is, it is assumed that, for example, a battery is connected to a VIN terminal (input terminal) and a GND terminal of the ideal diode circuit 1, and a load is connected between a VOUT terminal (output terminal) and a GND signal line.

The ideal diode circuit 1 conducts between the VIN terminal and the VOUT terminal when a voltage at the VIN terminal (node N1) is equal to or higher than a voltage at the VOUT terminal (node N2) (in a forward direction). In addition, when the voltage at the VOUT terminal becomes higher than the voltage at the VIN terminal (in a reverse direction), the ideal diode circuit 1 blocks the conduction between the VIN terminal and the VOUT terminal and prevents current backflow.

The MOS transistor 2 (an example of a field effect transistor) is, for example, a P-channel MOSFET (Metal Oxide Semiconductor field effect transistor) and includes a body diode 21. The MOS transistor 2 has a source terminal connected to the node N2, a drain terminal connected to the node N1, and a gate terminal connected to a node N3. Here, the MOS transistor 2 is connected so that the body diode 21 is in the forward direction. A voltage at the gate terminal is controlled by a transistor controller 11 described later, so that the MOS transistor 2 functions as a diode element in the ideal diode circuit 1.

Here, since the MOS transistor 2 has the body diode 21, current flows from the drain terminal (node N1) to the source terminal (node N2) when the voltage at the drain terminal (node N1) becomes higher than the voltage at the source terminal (node N2) by the forward voltage or more.

The control circuit 10 includes the transistor controller 11 and a current controller 12.

The transistor controller 11 controls the voltage at the gate terminal (node N3) of the MOS transistor 2 in accordance with a difference in voltage between the source terminal (node N2) and the drain terminal (node N1) of the MOS transistor 2.

For example, when the voltage at the drain terminal (node N1) is equal to or higher than the voltage at the source terminal (node N2), the transistor controller 11 controls the voltage at the gate terminal (node N3) so that a current according to the load flows through the MOS transistor 2, and turns on the MOS transistor 2 (on state). In addition, for example, when the voltage at the source terminal (node N2) is higher than the voltage at the drain terminal (node N1), the transistor controller 11 controls the voltage at the gate terminal (node N3) so as to prevent a reverse bias current from flowing into the MOS transistor 2, and turns off the MOS transistor 2 (off state).

Further, the transistor controller 11 includes a differential amplifier 111.

The differential amplifier 111 (an example of a differential amplifier circuit) is, for example, an operational amplifier and controls the voltage at the gate terminal (node N3) in accordance with the difference in voltage between the drain terminal (node N1) and the source terminal (node N2). Here, a Vds voltage (=drain voltage−source voltage) changes in accordance with the load. When the Vds voltage is a positive value, the differential amplifier 111 controls the voltage at the gate terminal (node N3) so that a larger current flows through the MOS transistor 2 as the value of the Vds voltage is larger, and controls the voltage at the gate terminal (node N3) so that a smaller current flows through the MOS transistor 2 as the value of the Vds voltage is smaller. Additionally, the differential amplifier 111 controls the voltage at the gate terminal (node N3) so that the MOS transistor 2 is turned off when the Vds voltage is a negative value. Here, when the Vds voltage is a positive value, the Vds voltage is larger as the load is larger.

Specifically, when the MOS transistor 2 is made conductive, the differential amplifier 111 outputs to the gate terminal (node N3), a voltage lower than the voltage at the source terminal (node N2). Additionally, when the conduction of the MOS transistor 2 is cut off, the differential amplifier 111 outputs to the gate terminal (node N3), a voltage equal to or higher than the voltage at the source terminal (node N2).

The differential amplifier 111 has a + terminal (non-inverting input terminal) connected to the node N2, a − terminal (inverting input terminal) connected to the node N1, and an output terminal connected to the gate terminal (node N3) of the MOS transistor 2. Here, the differential amplifier 111 may include, for example, a differential (comparator) and an output amplifier. Additionally, the differential amplifier 111 may have a predetermined offset value when comparing the + terminal (non-inverting input terminal) and the − terminal (inverting input terminal).

Further, the differential amplifier 111 operates with a current source supplied from the current controller 12.

The current controller 12 controls, in accordance with the load, operating current for operating the transistor controller 11. For example, the current controller 12 reduces the operating current for operating the transistor controller 11 when the voltage at the gate terminal (node N3) becomes a voltage at which a transistor current flowing through the MOS transistor 2 becomes equal to or lower than a predetermined current value. That is, the current controller 12 reduces the current of the current source supplied to the transistor controller 11 when the load is equal to or less than a predetermined threshold value. Thereby, the current controller 12 reduces the operating current of the transistor controller 11.

Additionally, the current controller 12 increases the operating current when the voltage at the gate terminal (node N3) becomes a voltage at which the transistor current exceeds the predetermined current value. That is, the current controller 12 increases the current of the current source supplied to the transistor controller 11 when the load exceeds the predetermined threshold value. Thereby, the current controller 12 increases the operating current of the transistor controller 11.

Further, the current controller 12 includes a startup current source 121, a VGS detection voltage current conversion circuit 122, and a current adder 123.

The startup current source 121 (an example of a first current source) supplies a constant current serving as a reference for the operating current at the time of startup in the control circuit 10. For example, the startup current source 121 generates a constant current source based on a constant voltage source, such as a band gap reference circuit. The startup current source 121 always operates as a constant current source in a state where the control circuit 10 is activated, and supplies the operating current to the transistor controller 11 via the current adder 123.

The VGS detection voltage current conversion circuit 122 (an example of a second current source) generates a current source in accordance with the voltage at the gate terminal (node N3), and supplies the current source to the transistor controller 11 via the current adder 123. The VGS detection voltage current conversion circuit 122 increases the current source supplied to the transistor controller 11, in accordance with a decrease in voltage at the gate terminal (node N3) (increase in load). In other words, the VGS detection voltage current conversion circuit 122 adds and supplies an additional constant current to the startup current source 121 when, for example, the voltage becomes a voltage at which the transistor current flowing through the MOS transistor 2 exceeds a predetermined current value.

Additionally, the VGS detection voltage current conversion circuit 122 decreases the current source supplied to the transistor controller 11, in accordance with an increase in voltage at the gate terminal (node N3) (decrease in load).

Here, a specific example of the VGS detection voltage current conversion circuit 122 will be described later with reference to FIG. 2.

The current adder 123 adds a current from the startup current source 121 and a current from the VGS detection voltage current conversion circuit 122, and supplies the resultant current to the transistor controller 11 as the current source.

Next, a specific example of the VGS detection voltage current conversion circuit 122 will be described with reference to FIG. 2.

FIG. 2 is a diagram illustrating a configuration example of the VGS detection voltage current conversion circuit 122 according to the present embodiment.

As shown in FIG. 2, the VGS detection voltage current conversion circuit 122 includes a resistor 124 and a MOS transistor 125. The resistor 124 and the MOS transistor 125 are connected in series, so that the VGS detection voltage current conversion circuit 122 forms the current source.

The resistor 124 has a first terminal connected to the node N2 and a second terminal connected to a source terminal of the MOS transistor 125.

The MOS transistor 125 is a P-channel MOSFET similar to the MOS transistor 2. The MOS transistor 125 has a source terminal connected to the node N2, a drain terminal connected to the node N4, and a gate terminal connected to the node N3. In accordance with the voltage at the gate terminal (node N3), the MOS transistor 125 outputs from the node N2 via the resistor 124, a current from the drain terminal, as the current source.

Here, in FIG. 2, the output line of the startup current source and the output line of the VGS detection voltage current conversion circuit 122 are connected at the node N4, and the node N4 corresponds to the above-described current adder 123. Thus, at the node N4, the output line of the startup current source and the output line of the VGS detection voltage current conversion circuit 122 are connected, so that the current from the startup current source 121 and the current from the VGS detection voltage current conversion circuit 122 are added and supplied to the transistor controller 11 as the current source.

In addition, when the voltage at the gate terminal (node N3) becomes equal to or greater than a predetermined voltage (for example, a negative value of the Vgs voltage (difference in voltage between the gate terminal and the source terminal) becomes equal to or lower than a threshold value Vth), the MOS transistor 125 turns off (off state), and the VGS detection voltage current conversion circuit 122 stops the supply of the current source.

Next, operations of the control circuit 10 and the ideal diode circuit 1 according to the present embodiment will be described with reference to the drawings.

FIG. 3 is a flowchart showing an example of the operation of the transistor controller 11 in the present embodiment.

As shown in FIG. 3, the transistor controller 11 of the control circuit 10 determines whether or not the voltage at the node N1 is equal to or higher than the voltage at the node N2 ((the voltage at the node N1−the voltage at the node N2)≥0) (step S101). For example, the differential amplifier 111 of the transistor controller 11 compares the voltage at the node N1 with the voltage at the node N2, and determines whether or not the voltage at the node N1 is equal to or higher than the voltage at the node N2. When the voltage at the node N1 is equal to or higher than the voltage at the node N2 (step S101: YES), the transistor controller 11 proceeds to step S103. In addition, when the voltage at the node N1 is lower than the voltage at the node N2 ((the voltage at the node N1−the voltage at the node N2)<0) (step S101: NO), the transistor controller 11 proceeds to step S102.

In step S102, the transistor controller 11 controls the voltage at the gate terminal (node N3) so that the MOS transistor 2 is turned off. That is, the differential amplifier 111 supplies to the gate terminal (node N3) of the MOS transistor 2, a voltage for turning off the MOS transistor 2. The transistor controller 11 returns to step S101 after the process in step S102.

Additionally, in step S103, the transistor controller 11 applies to the gate terminal (node N3), a voltage in accordance with the difference in voltage between the node N1 and the node N2 (the voltage at the node N1−the voltage at the node N2), thus turning on the MOS transistor 2. That is, the differential amplifier 111 changes and supplies the voltage at the gate terminal (node N3) so that the current of the MOS transistor 2 (transistor current) increases as the value of (the voltage at the node N1−the voltage at the node N2) increases, and the transistor current decreases as the value of (the voltage at the node N1−the voltage at the node N2) decreases. The transistor controller 11 returns to step S101 after the process in step S103.

Next, the operation of the current controller 12 according to the present embodiment will be described with reference to FIG. 4.

FIG. 4 is a flowchart showing an example of the operation of the current controller 12 in the present embodiment.

As shown in FIG. 4, the current controller 12 of the control circuit 10 first determines whether or not the voltage at the gate terminal (node N3) is equal to or higher than the predetermined voltage (step S201). That is, based on whether or not the MOS transistor 125 is in the on-state, the VGS detection voltage current conversion circuit 122 of the current controller 12 determines whether or not the voltage at the gate terminal (node N3) is equal to or higher than the predetermined voltage. When the voltage at the gate terminal (node N3) is equal to or higher than the predetermined voltage (step S201: YES), the current controller 12 proceeds to step S202. Additionally, if the voltage at the gate terminal (node N3) is lower than the predetermined voltage (step S201: NO), the current controller 12 proceeds to step S203.

In step S202, the current controller 12 stops the VGS detection voltage current conversion circuit 122. That is, when the MOS transistor 125 is turned off, the current source from the VGS detection voltage current conversion circuit 122 is stopped, and the current controller 12 reduces the operating current of the transistor controller 11. The current controller 12 returns to step S201 after the process in step S202.

Additionally, in step S203, the current controller 12 adds the current from the VGS detection voltage current conversion circuit 122 to the startup current of the startup current source 121 and supplies the resultant current to the transistor controller 11. That is, when the MOS transistor 125 is turned on, the VGS detection voltage current conversion circuit 122 functions as the current source, and the current flowing through the resistor 124 and the MOS transistor 125 (additional constant current) is added to the startup current of the startup current source 121, and the resultant current is supplied to the transistor controller 11. Thereby, the current controller 12 increases the operating current of the transistor controller 11. The current controller 12 returns to step S201 after the process in step S203.

Next, operations of the control circuit 10 and the ideal diode circuit 1 according to the present embodiment will be described with reference to FIGS. 5 to 7

FIG. 5 is a first timing chart showing an example of the operation of the control circuit 10 in the present embodiment. In this figure, a vertical axis of each graph indicates, in order from the top, the voltages at the node N1 and the node N2, the input current from the battery, the current passing through the MOS transistor 2, the load current, and the current at the GND terminal. In addition, a horizontal axis of each graph indicates time.

Additionally, in FIG. 5, waveforms W1 to W6 indicate a voltage waveform at the node N1, a voltage waveform at the node N2, a waveform of the input current from the battery, a waveform of the current passing through the MOS transistor 2, a waveform of the load current, and a current waveform of the control circuit 10 including the operating current of the transistor controller 11, in this order. Here, the voltage at the node N1 is an output voltage of the battery. In addition, each current is shown assuming that a current in the input direction is a positive current, while an output current is a negative current.

When the load current increases at time T1 in FIG. 5 (see waveform W5), the voltage at the node N2 decreases below the voltage at the node N1, in accordance with the load current. As a result, the differential amplifier 111 of the transistor controller 11 decreases the voltage at the gate terminal (node N3) so that the current flowing through the MOS transistor 2 increases in accordance with the difference in voltage between the node N1 and the node N2. When the voltage at the gate terminal (node N3) decreases, the input current from the battery and the current passing through the MOS transistor 2 increase (see waveforms W3 and W4). Further, when the voltage at the gate terminal (node N3) decreases, the VGS detection voltage current conversion circuit 122 starts operating, and the operating current of the transistor controller 11 increases (see waveform W6).

Additionally, at time T2, when the load current decreases and the node N2 becomes at a high voltage so that a reverse bias occurs (see waveform W2), the differential amplifier 111 of the transistor controller 11 supplies to the gate terminal (node N3), the voltage for turning off the MOS transistor 2 so as to prevent current backflow due to the reverse bias. Thereby, the MOS transistor 2 functions as a diode, thereby preventing the high voltage at node N2 from flowing back to the battery.

Further, at time T3, when the high voltage at the node N2 is resolved (see waveform W2) and, for example, the state shifts to a standby state or the like where the load current is small, the current controller 12 causes the VGS detection voltage current conversion circuit 122 to stop operating so that the operating current of the transistor controller 11 is reduced. In this case, as indicated by the waveform W6, the current of the control circuit 10 including the operating current of the transistor controller 11 can be kept low.

Additionally, FIG. 6 is a second timing chart showing an example of the operation of the control circuit 10 in the present embodiment. In this figure, a vertical axis of each graph indicates, in order from the top, the voltage at the gate terminal (node N3), the voltage at the source terminal (node N2), the Vgs voltage, and the load current. In addition, a horizontal axis of each graph indicates time.

Further, in FIG. 6, waveforms W11 to W14 indicate a voltage waveform at the gate terminal (node N3), a voltage waveform at the source terminal (node N2), a Vgs voltage, and a waveform of the load current, in this order. Here, the Vgs voltage indicates a voltage (the voltage at the gate terminal−the voltage at the source terminal) obtained by subtracting the voltage at the source terminal (node N2) from the voltage at the gate terminal (node N3).

Additionally, in FIG. 6, time T1 to time T3 are the same as time T1 to time T3 shown in FIG. 5.

At time T1, when the load current increases (see waveform W14), the voltage at the source terminal (node N2) decreases. In response to this, the differential amplifier 111 of the transistor controller 11 reduces the voltage at the gate terminal (node N3) in accordance with the difference in voltage between the node N1 and the node N2, so that the current flowing through the MOS transistor 2 increases (see waveform W11). Then, as a result, the Vgs voltage of the MOS transistor 2 comes to have a waveform as indicated by the waveform W13, and the MOS transistor 2 is turned on. In this case, the MOS transistor 2 functions as a diode through which a current flows in the forward direction.

Further, at time T2, when the load current decreases and the node N2 becomes at a high voltage so that a reverse bias occurs, the differential amplifier 111 of the transistor controller 11 supplies to the gate terminal (node N3), a voltage for turning off the MOS transistor 2, as indicated by the waveform W11. In this case, the MOS transistor 2 functions as a diode to which the reverse bias is applied, and prevents current backflow due to the reverse bias.

Further, at time T3, when the high voltage at the node N2 is resolved (see waveform W12) and, for example, the state shifts to the standby state or the like where the load current is small, the differential amplifier 111 of the transistor controller 11 supplies to the gate terminal (node N3), the voltage in accordance with the load current (see waveform W11). That is, the differential amplifier 111 supplies to the gate terminal (node N3), a voltage in accordance with the difference in voltage between the node N1 and the node N2.

Additionally, FIG. 7 is a diagram showing an example of the operation of the current controller 12 in the present embodiment. In this figure, a vertical axis of each graph indicates, in order from the top, the Vds voltage and the current consumption of the control circuit 10. Further, a horizontal axis of each graph shows a log plot (logarithmic plot) of the load current (load current Iout).

Further, in FIG. 7, a waveform W21 and a waveform W22 indicate a waveform of the Vds voltage and a waveform of the current consumption of the control circuit 10, in this order. Here, the Vds voltage indicates a voltage (the voltage at the drain terminal–the voltage at the source terminal) obtained by subtracting the voltage at the source terminal (node N2) from the voltage at the drain terminal (node N1) of the MOS transistor.

As indicated by the waveform W21 in FIG. 7, the Vds voltage of the MOS transistor 2 increases as the load current Iout increases. Further, the current controller 12 increases the operating current of the transistor controller 11 in accordance with the increase in load current Iout. Thereby, as indicated by the waveform W22, the current consumption of the control circuit 10 increases as the load current Iout increases. Here, in this case, since the operating current of the transistor controller 11 increases, the MOS transistor 2 can be quickly turned off.

Further, the current controller 12 decreases the operating current of the transistor controller 11 when the operating current of the transistor controller 11 decreases. Thereby, the current consumption of the control circuit 10 is reduced during a light load, such as in the standby state.

As described above, the control circuit 10 according to the present embodiment includes the transistor controller 11 and the current controller 12. The transistor controller 11 controls the voltage at the gate terminal (node N3) of the MOS transistor 2 in accordance with the difference in voltage between the source terminal (node N2) and the drain terminal (node N1) of the MOS transistor 2 (field effect transistor) connected so that the body diode 21 is in the forward direction. The current controller 12 reduces the operating current for operating the transistor controller 11 when the load connected via the source terminal (node N2) of the MOS transistor 2 is light, and increases the operating current when the load is heavy.

Thereby, the transistor controller 11 controls the MOS transistor 2 as an ideal diode, and the current controller 12 appropriately controls the operating current for operating the transistor controller 11, in accordance with the load. Therefore, the control circuit 10 according to the present embodiment reduces the operating current for operating the transistor controller 11 in the standby state, such as during a light load, so that the current consumption can be reduced in the standby state while maintaining the function of the ideal diode.

Further, in the present embodiment, the current controller 12 reduces the operating current for operating the transistor controller 11 when the voltage at the gate terminal (node N3) becomes the voltage at which the transistor current flowing through the MOS transistor 2 becomes equal to or lower than the predetermined current value; and increases the operating current for operating the transistor controller 11 when the voltage at the gate terminal (node N3) becomes the voltage at which the transistor current exceeds the predetermined current value.

As a result, the current controller 12 reduces the operating current for operating the transistor controller 11 when the voltage at the gate terminal (node N3) is a voltage corresponding to a light load; and increases the operating current for operating the transistor controller 11 when the voltage is a voltage corresponding to a heavy load. Therefore, the control circuit 10 according to the present embodiment can reduce the current consumption in the standby state while maintaining the function of the ideal diode by the simple method of increasing or decreasing the operating current by the voltage of the gate terminal (node N3).

Additionally, in the present embodiment, the current controller 12 includes: the startup current source 121 (first current source) that supplies a constant current serving as the reference for the operating current at the time of startup; and the VGS detection voltage current conversion circuit 122 (second current source) that adds and supplies an additional constant current to the startup current source 121 when the voltage at the gate terminal becomes the voltage at which the transistor current flowing through the MOS transistor 2 exceeds the predetermined current value.

Accordingly, the control circuit 10 according to the present embodiment can appropriately control the operating current for operating the transistor controller 11 with the simple configuration in which the additional current source (the VGS detection voltage current conversion circuit 122) is added to the startup current source 121.

Additionally, in this embodiment, the transistor controller 11 includes the differential amplifier 111 (differential amplifier circuit) that controls the voltage at the gate terminal in accordance with the difference in voltage between the drain terminal and the source terminal.

Thereby, the control circuit 10 according to the present embodiment can appropriately control the MOS transistor 2 as an ideal diode with the simple circuit configuration.

Further, the ideal diode circuit 1 according to the present embodiment includes the control circuit 10 and the MOS transistor 2.

Thereby, like the control circuit 10, the ideal diode circuit 1 according to the present embodiment can reduce the current consumption in the standby state while maintaining the function of the ideal diode.

Second Embodiment

Next, a control circuit 10a and an ideal diode circuit 1a according to a second embodiment will be described with reference to the drawings.

FIG. 8 is a block diagram showing an example of a configuration of the ideal diode circuit 1a according to the present embodiment.

As shown in FIG. 8, the ideal diode circuit 1a includes the MOS transistor 2 and a control circuit 10a.

Here, in this figure, the same components as those in FIG. 1 described above are denoted by the same reference numerals, and description thereof is omitted.

The ideal diode circuit 1a conducts between the VIN terminal and the VOUT terminal when the voltage at the VIN terminal (node N1) is equal to or higher than the voltage at the VOUT terminal (node N2) (in the forward direction). In addition, when the voltage at the VOUT terminal becomes higher than the voltage at the VIN terminal (in the reverse direction), the ideal diode circuit 1 blocks the conduction between the VIN terminal and the VOUT terminal and prevents current backflow.

The control circuit 10a includes the transistor controller 11 and a current controller 12a.

This embodiment differs from the first embodiment in that a configuration of the current controller 12a differs.

The current controller 12 controls, in accordance with the load, the operating current for operating the transistor controller 11. For example, the current controller 12 reduces the operating current for operating the transistor controller 11 when the voltage at the gate terminal (node N3) becomes a voltage at which the transistor current flowing through the MOS transistor 2 becomes equal to or lower than a predetermined current value. That is, the current controller 12 reduces the current of the current source supplied to the transistor controller 11 when the load is equal to or less than a predetermined threshold value. Thereby, the current controller 12 reduces the operating current of the transistor controller 11.

The current controller 12a increases the operating current when the voltage at the gate terminal (node N3) becomes a voltage at which the transistor current exceeds the predetermined current value. That is, the current controller 12a increases the current of the current source supplied to the transistor controller 11 when the load exceeds the predetermined threshold value. Thus, the current controller 12a increases the operating current of the transistor controller 11.

Additionally, the current controller 12a includes a plurality of current sources 120 (first current source 120-1, second current source 120-2, . . . ), a VGS detector 126, a current source selector 127, and a switch 128.

Here, in the present embodiment, the first current source 120-1, the second current source 120-2, . . . are current sources having different current values, and will be described as the current source 120 when each indicates an arbitrary current source included in the control circuit 10a, and unless otherwise distinguished from one another.

Additionally, the current controller 12a switches the plurality of current sources 120 in accordance with the voltage at the gate terminal (node N3), and supplies a constant current serving as a reference for the operating current of the transistor controller 11. Here, the current controller 12a may select any one or a combination of the plurality of current sources 120 in accordance with the voltage at the gate terminal (node N3), and supply a constant current serving as a reference for the operating current.

The current source 120 generates the constant current serving as the reference for the operating current, and supplies the generated constant current to the transistor controller 11. Here, for example, the second current source 120-2 supplies a constant current larger than that of the first current source 120-1, and the plurality of current sources 120 each supply constant currents having different sizes.

The VGS detector 126 detects a voltage (Vgs voltage) at the gate terminal (node N3).

For example, the switch 128 is a changeover switch such as a transistor, and supplies to the transistor controller 11, the constant current that is an output of the current source 120 selected by the current source selector 127.

In accordance with the voltage (Vgs voltage) at the gate terminal (node N3) detected by the VGS detector 126, the current source selector 127 selects from the plurality of current sources 120, a current source 120 that supplies the constant current to the transistor controller 11. The current source selector 127 outputs a control signal to the switch 128 so that the constant current is supplied from the selected current source 120 to the transistor controller 11.

For example, when the voltage at the gate terminal (node N3) becomes a voltage at which the transistor current becomes equal to or lower than a predetermined current value (equal to or higher than a first threshold value), the current source selector 127 selects the first current source 120-1 and reduces the operating current for operating the transistor controller 11. In addition, for example, when the voltage at the gate terminal (node N3) becomes a voltage at which the transistor current exceeds the predetermined current value (less than the first threshold value), the current source selector 127 selects the second current source 120-2 and increases the operating current for operating the transistor controller 11.

Next, operations of the control circuit 10a and the ideal diode circuit 1a according to the present embodiment will be described with reference to the drawings.

FIG. 9 is a flowchart showing an example of the operation of the current controller 12a in the present embodiment.

In FIG. 9, the current controller 12a first detects the Vgs voltage (step S301). That is, the VGS detector 126 of the current controller 12a detects the voltage (Vgs voltage) at the gate terminal (node N3).

Next, the current controller 12a selects a current source 120 in accordance with the Vgs voltage (step S302). In other words, in accordance with the voltage (Vgs voltage) at the gate terminal (node N3) detected by the VGS detector 126, the current source selector 127 of the current controller 12a selects from the plurality of current sources 120, a current source 120 that supplies the constant current to the transistor controller 11. For example, when the Vgs voltage is equal to or higher than the first threshold value, the current source selector 127 selects the first current source 120-1. In addition, for example, when the Vgs voltage is less than the first threshold value, the current source selector 127 selects the second current source 120-2 having a larger current than that of the first current source 120-1. The current source selector 127 outputs a control signal to the switch 128 so that the constant current is supplied from the selected current source 120 to the transistor controller 11. The current controller 12a returns to step S301 after the process in step S302.

Here, since operations other than that of the above-described current controller 12a are the same as those in the first embodiment, description thereof is omitted here.

As described above, the control circuit 10a according to the present embodiment includes the transistor controller 11 and the current controller 12a. The transistor controller 11 controls the voltage at the gate terminal (node N3) of the MOS transistor 2 in accordance with the difference in voltage between the source terminal (node N2) and the drain terminal (node N1) of the MOS transistor 2 (field effect transistor) connected so that the body diode 21 is in the forward direction. The current controller 12a reduces the operating current for operating the transistor controller 11 when the load connected via the source terminal (node N2) of the MOS transistor 2 is light, and increases the operating current when the load is heavy.

Thereby, the control circuit 10a according to the present embodiment has the same effect as that of the first embodiment, and can reduce the current consumption in the standby state while maintaining the function of the ideal diode.

Additionally, in the present embodiment, the current controller 12a includes the plurality of current sources 120 each of which supplies the constant current serving as the reference for the operating current for operating the transistor controller 11, switches the plurality of current sources 120 in accordance with the voltage (Vgs voltage) at the gate terminal (node N3), and supplies to the transistor controller 11, the constant current serving as the reference for the operating current.

Thereby, the control circuit 10a according to the present embodiment can appropriately control the operating current for operating the transistor controller 11 with the simple configuration in which the plurality of current sources 120 are switched and used.

Further, in the present embodiment, the current controller 12a may select any one or a combination of the plurality of current sources 120 in accordance with the voltage at the gate terminal, thus supplying the constant current serving as the reference for the operating current. In other words, in accordance with the voltage (Vgs voltage) at the gate terminal (node N3), the current controller 12a selects any one or a combination of the plurality of current sources 120 so that the constant current to be supplied increases as the transistor current increases, and supplies to the transistor controller 11, the constant current serving as the reference for the operating current.

As a result, the control circuit 10a according to the present embodiment can finely control the operating current for operating the transistor controller 11 by selecting or combining the plurality of current sources 120, thereby reducing current consumption.

Here, the present invention is not limited to the above-described embodiments, and can be modified without departing from the spirit of the present invention.

For example, although the case where the P-channel MOSFET is used as an example of the field effect transistor has been described in each of the above-described embodiments, the present invention is not limited thereto. For example, the ideal diode circuit 1 (1a) may use another type of field effect transistor, such as an N-channel MOSFET, as the field effect transistor.

Additionally, although the example in which the current controller 12a switches between the two current sources 120, which are the first current source 120-1 and the second current source 120-2, has been described in the above second embodiment, three or more current sources 120 may be switched and used. In addition, the current controller 12a may add and supply the second current source 120-2 as an additional constant current to the first current source 120-1, as in the first embodiment.

Further, some or all of the functions of the control circuit 10 (10a) and the ideal diode circuit 1 (1a) described above may be realized as an integrated circuit, such as an LSI (Large Scale Integration).

DESCRIPTION OF REFERENCE NUMERALS 1, 1a ideal diode circuit
2, 125 MOS transistor
10, 10a control circuit
11 transistor controller
12, 12a current controller
21 body diode
111 differential amplifier
120 current source
120-1 first current source
120-2 second current source
121 startup current source
122 VGS detection voltage current conversion circuit
123 current adder
124 resistor
126 VGS detector
127 current source selector
128 switch

The invention claimed is:

1. A control circuit comprising:
a transistor controller that controls a voltage at a gate terminal of a field effect transistor in accordance with a difference in voltage between a source terminal and a drain terminal of the field effect transistor connected so that a body diode is in a forward direction; and
a current controller that
reduces an operating current for operating the transistor controller when a load connected via the source terminal of the field effect transistor is light, and
increases the operating current when the load is heavy, wherein the current controller comprises:
a detection circuit that
detects the voltage at the gate terminal of the field effect transistor, and
determines whether the load is light or heavy, based on the voltage at the gate terminal of the field effect transistor.

2. The control circuit of claim 1, wherein
the current controller
reduces the operating current for operating the transistor controller when the voltage at the gate terminal becomes a voltage at which a transistor current flowing through the field effect transistor becomes equal to or lower than a predetermined current value, and
increases the operating current when the voltage at the gate terminal becomes a voltage at which the transistor current exceeds the predetermined current value.

3. The control circuit of claim 2, wherein
the current controller comprises:
a first current source that supplies a constant current serving as a reference for the operating current at the time of startup; and
a second current source that adds and supplies an additional constant current to the first current source when the voltage at the gate terminal becomes the voltage at which the transistor current flowing through the field effect transistor exceeds the predetermined current value.

4. The control circuit of claim 1, wherein
the current controller
comprises a plurality of current sources each of which supplies a constant current serving as a reference for the operating current,
switches the plurality of current sources in accordance with the voltage at the gate terminal, and
supplies the constant current serving as the reference for the operating current.

5. The control circuit of claim 4, wherein
the current controller
selects any one or a combination of the plurality of current sources in accordance with the voltage at the gate terminal, and
supplies the constant current serving as the reference for the operating current.

6. The control circuit of claim 1, wherein
the transistor controller comprises:
a differential amplifier circuit that controls the voltage at the gate terminal in accordance with the difference in voltage between the drain terminal and the source terminal.

7. An ideal diode circuit comprising:
a control circuit; and
a field effect transistor, wherein
the control circuit comprises:
a transistor controller that controls a voltage at a gate terminal of the field effect transistor in accordance with a difference in voltage between a source terminal and a drain terminal of the field effect transistor connected so that a body diode is in a forward direction; and
a current controller that reduces an operating current for operating the transistor controller when a load connected via the source terminal of the field effect transistor is light, and increases the operating current when the load is heavy, wherein the current controller comprises:

a detection circuit that detects the voltage at the gate terminal of the field effect transistor, and determines whether the load is light or heavy, based on the voltage at the gate terminal of the field effect transistor.

\* \* \* \* \*